(12) United States Patent
Vissing et al.

(10) Patent No.: US 7,157,145 B2
(45) Date of Patent: Jan. 2, 2007

(54) ARTICLE HAVING A PLASMAPOLYMER COATING AND METHOD FOR PRODUCING THE SAME

(75) Inventors: Klaus D. Vissing, Morsum (DE); Guido Ellinghorst, Bremen (DE); Gabriele Neese, Bremen (DE)

(73) Assignee: Fraunhofer Gesellschaft zur Forderung der Angewandten Forschung E.V., Munich (DE)

( * ) Notice: Subject to any disclaimer, the term of this patent is extended or adjusted under 35 U.S.C. 154(b) by 280 days.

(21) Appl. No.: 10/482,086

(22) PCT Filed: Jun. 28, 2002

(86) PCT No.: PCT/EP02/07180

§ 371 (c)(1),
(2), (4) Date: Dec. 22, 2003

(87) PCT Pub. No.: WO03/002269

PCT Pub. Date: Jan. 9, 2003

(65) Prior Publication Data

US 2004/0180210 A1    Sep. 16, 2004

(30) Foreign Application Priority Data

Jun. 29, 2001   (DE) ................. 101 31 156

(51) Int. Cl.
*B32B 9/04* (2006.01)

(52) U.S. Cl. ............... 428/447; 427/452; 427/489; 428/446

(58) Field of Classification Search ................. None
See application file for complete search history.

(56) References Cited

U.S. PATENT DOCUMENTS 4,508,606 A * 4/1985 Andrade et al. ............ 204/169
5,230,929 A   7/1993 Caporiccio et al. ......... 427/536
5,641,559 A * 6/1997 Namiki ....................... 428/216
2003/0162410 A1* 8/2003 Huang et al. ............... 438/780

FOREIGN PATENT DOCUMENTS

| DE | 42 16 999 A1 | 11/1993 |
| DE | 195 43 133 A1 | 5/1997 |
| DE | 197 48 240 A1 | 5/1999 |
| DE | 199 21 303 C1 | 10/2000 |
| DE | 100 56 564 A1 | 9/2001 |
| DE | 100 47 124 A1 | 10/2001 |
| DE | 100 34 737 A1 | 2/2002 |
| EP | 0 960 958 A2 | 12/1999 |
| EP | 1 123 991 A2 | 8/2001 |
| EP | 1 260 606 A2 | 1/2002 |
| WO | WO 96/04123 | 2/1996 |
| WO | WO 99/22878 | 5/1999 |

OTHER PUBLICATIONS

"Plasma Deposition of Thin Films From a Fluorine-Containing Cyclosiloxane" authored by D'Agostino et al. and published in J. Polym. Sci., Part A Polymer Chemistry (1994) 32, 121-130.*

* cited by examiner

*Primary Examiner*—Marc S. Zimmer
(74) *Attorney, Agent, or Firm*—Weingarten, Schurgin, Gagnebin & Lebovici LLP

(57) ABSTRACT

An article is described comprising
 a substrate
 and a plasma polymer coating comprising silicon, oxygen and carbon bonded to the surface of the substrate, in respect of which coating the following applies in the case of determination by means of ESCA:
  the mole ratio O: Si is >1.25 and <2.6
  and the mole ratio C: Si is >0.6 and <2.2,
according to a preferred embodiment the coating contains
 at least 22 and at most 27 atomic percent Si,
 at least 25 and at most 50 atomic percent O and
 at least 25 and at most 50 atomic percent C
based on its total atomic number without hydrogen and/or fluorine.

13 Claims, 1 Drawing Sheet

ARTICLE HAVING A PLASMAPOLYMER COATING AND METHOD FOR PRODUCING THE SAME

Figure 1:
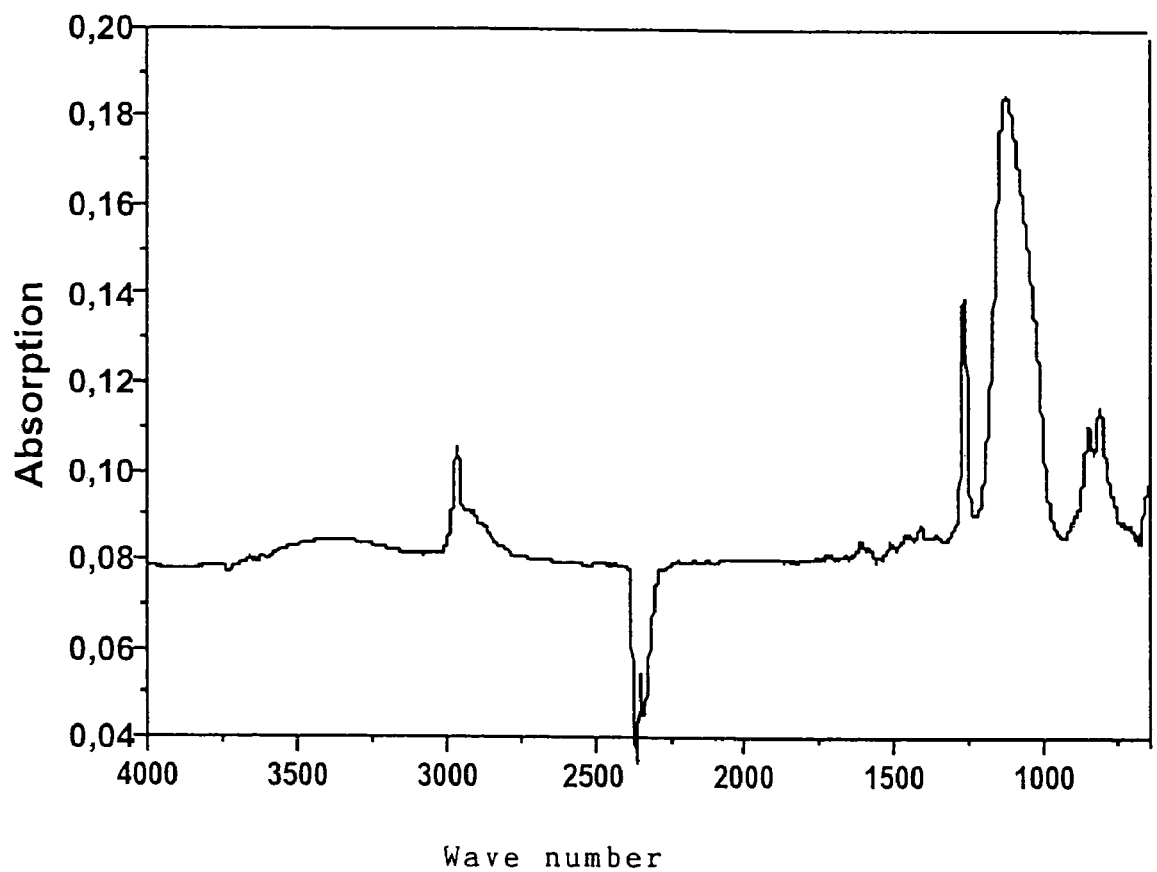

This application is a 371 national phase filing of PCT/EPO02/07180 filed Jun. 28, 2002, and claims priority to a German application No. 101 31 156.7 filed Jun. 29, 2001.

The present invention relates to articles with a plasma polymer coating and to methods for the preparation of such articles.

Articles with a plasma polymer coating have been known for a long time.

Thus, silver articles which have a plasma polymer coating were already described in DE 42 16 999 A1. Because of a stepwise variation in the process parameters, the coatings have a layer structure, it being possible, in particular to differentiate a coupling layer, a permeation-preventing layer and a hard, scratch-resistant surface sealing. A mixture of oxygen ($O_2$) and hexamethyldisiloxane (HMDSO) is used for the preparation of the scratch-resistant layer. However, neither the precise mixing ratio of $O_2$ and HMDSO nor the structure or composition of the scratch-resistant layer itself is indicated.

Moreover the multi-layer coatings that are disclosed in DE 42 16 999 A1 can easily be removed from the silver substrate again.

A method for the production of thin, highly hydrophobic polymer layers by means of plasma polymerisation is described in DE 195 43 133 A1. The monomers indicated for plasma polymerisation are vinylmethylsilane and vinyltrimethoxysilane, which are monomers that have at least one group with a low affinity for oxygen and which can be plasma polymerised with substantial retention of the structure. Non-polymerisable gases, such as, for example, noble gas, oxygen or hydrogen can be added to the said monomers as auxiliary gas or carrier gas in order to improve the homogeneity of the plasma and to increase the pressure in the gas phase.

Methods for corrosion-resistant coating of metal substrates by means of plasma polymerisation are described in DE 197 48 240 A1, the metal substrate initially being subjected in a first pre-treatment step to mechanical, chemical and/or electrochemical smoothing and then being subjected to plasma activation in a second process step, before the plasma polymer coating is then applied. Hydrocarbon and/or organosilicon compounds are indicated as the main constituent of the plasma polymers, the use of hexamethyldisiloxane and hexamethylcyclotrisiloxane being said to be particularly preferred. Hexamethyidisiloxane is used in the examples of DE 197 48 240 A1, it being possible to admix oxygen and nitrogen as additional gases.

However, there are no data on the ratio of monomer and oxygen or data on the structure and chemical composition of the resulting plasma polymer coating in DE 197 48 240 A1. Moreover, DE 197 48 240 A1 does not teach how and on which substrate a plasma polymer coating has to be applied in order to prepare a surface that is particularly easy to clean.

However, surfaces that are easy to clean are required in a large number of fields of application. Thus, for example, rims for cars should not only be corrosion-resistant and protected against stone impact, but at the same time should also be easy to clean.

So-called self-cleaning surfaces of articles, which are characterised by a surface structure of elevations and depressions, have already been described in WO 96/04123 (Wilhelm Barthlott). With these surfaces the distance between the elevations must be in the range of 5 to 200 µm and the height of the elevations in the range from 5 to 100 µm. At least the elevations should consist of hydrophobic polymers or materials that have been rendered durably hydrophobic.

The effects described in WO 96/04123 became popular under the name "Lotus Effect".

In our own work, which has not yet been published, we have studied the effects of surface structures on the soiling and self-cleaning characteristics of plasma polymer-coated articles. During these studies we confirmed the findings summarised under the term Lotus Effect.

It therefore appears the more surprising that particularly high quality plasma polymer surfaces that are particularly easy to clean (self-cleaning), are also obtainable without providing a surface structure of elevations and depressions giving rise to the Lotus Effect if the composition and the structure of the surface meet certain conditions.

Articles according to the invention that are easy to clean comprise a substrate and a plasma polymer coating containing silicon, oxygen and carbon that is bonded to the surface of the substrate, in which coating:

the mole ratio O: Si is >1.25, preferably >1.35, and more preferentially >1.4 and at the same time <2.6, preferably <2.0, and more preferentially <1.9 and the mole ratio: C: Si is >0.6, preferably >1.00, more preferentially 1.2, and even more preferentially >1.29 and at the same time <C (sic) 2.2, preferably <1.76, and more preferentially <1.7.

measured by ESCA (electron spectroscopy for chemical analysis), preferably on the side facing away from the substrate (further details on the measurement are given further below). In this context "mole ratio X:Y" is to be understood here and further below as the ratio ($n_x:n_y$).

The articles according to the invention can be cleaned easily, largely independently of their surface structure.

The plasma polymer coating according to the invention preferably comprises, based on its total atomic number without hydrogen and/or fluorine, at least 22, preferably 23, more preferentially 23.9 and at most 27, preferably 26.1, more preferentially 25 atomic percent Si, at least 25, preferably 31, more preferentially 34.2 and at most 50, preferably 47, more preferentially 40.2 atomic percent O and at least 25, preferably 27, more preferentially 33.8 and at most 50, preferably 44, more preferentially 40.4 atomic percent C measured by ESCA (electron spectroscopy for chemical analysis), preferably on the side facing away from the substrate (more details on the measurement are given further below).

In addition to the said elements of oxygen, carbon and silicon, the plasma polymer coating preferably contains hydrogen (not detectable by ESCA) and/or fluorine, where:

$1.8:1 < n(H \text{ and/or } F):n(C) < 3.6:1$ preferably $2.2:1 < n(H \text{ and/or } F):n(C) < 3.3:1$ The determinations of the water content were carried out by microelementary analysis, a salt crystal first being coated, so that the coating could be stripped off in a water bath. The coating stripped off was dried at 100° C. to constant weight. The percentages by mass for hydrogen and carbon were then determined.

In some cases it is advantageous to produce an (essentially) fluorine-free or an (essentially) hydrogen-free layer. Moreover, when the abovementioned preferred ranges are chosen for the composition of the layer consisting of silicon, carbon and oxygen as well as, optionally, hydrogen and/or fluorine, distinct improvements with regard to one or more of the properties listed below are obtained:.
thermal stability
chemical stability
mechanical stability
hydrophobicity (which can be quantified by specifying the angle of contact with water)
hardness The substrate can consist of diverse materials, for example of plastic, enamel, metal, ceramic or glass. The substrate material chosen in the individual case is either provided with the plasma polymer coating immediately, i.e without pre-treatment, or its surface is cleaned and/or activated and/or provided with a plasma polymer adhesion promoter beforehand.

Articles according to the invention for which the roughness value $R_a$ (determined according to DIN 4768) of a plasma polymer coating forming the surface has a value of less than 1 μm, preferably a value of less then 0.3 μm and more preferentially a value of less than 0.1 μm are particularly easy to clean. The surface of the coating is thus extremely smooth, which is in direct contradiction to the findings summarised under the term Lotus Effect.

Plasma polymer coatings reproduce the contour, so that, correspondingly, substrates with correspondingly smooth surfaces are particularly suitable for the manufacture of articles that are easy to clean. Metallic substrates can be subjected to mechanical, chemical and/or electrochemical smoothing, such as is described, for example, in DE 197 48 240 A1, in order to obtain a very smooth surface. Such smoothing of a metallic substrate can be followed by a surface treatment by means of a plasma that has been adjusted to be reducing, in particular a hydrogen plasma, as is also described DE 197 48 240 A1, and when metallic substrates are used this treatment is in particular provided if the plasma polymer coating composed according to the invention is to be durably bonded to the metallic substrate.

If non-metallic substrates are to be coated, that is to say, for example, plastics, enamels, ceramics or glasses, a smoothing pre-treatment is optionally also carried out so that the substrate surface is already as smooth as the surface of the plasma polymer coating subsequently to be applied. If appropriate, the substrate surface is activated and/or provided with an adhesion promoter.

In order to be able to generate low solid surface energies, $CF_3$ groups in particular are of interest in addition to $CH_3$ groups. In this context it is immaterial whether these groups are present as a mixture or on their own. Precursors that can be used are, for example: $CF_4$, $C_2F_8$ or (3,3,3-trifluoropropyl) trimethoxysilane (sic) and trifluoromethyltrimethylsilane. Mixtures of precursors can also be used as long as the production of $CH_3$ or $CF_3$ groups is ensured.

Preferably, a plasma polymer coating which forms the surface of an article according to the invention has an angle of contact with water of >90°, preferably >95°, and more preferentially >100°. In order to achieve the said angle of contact with water, a person skilled in the art will select suitable precursors or precursor mixtures (gas ratios) and set suitable operating parameters for the plasma installation, i.e. in particular the pressure, the throughput rate of the precursor and the power (in the case of electric discharge).

The use of a non-equilibrium plasma is preferred for application of the plasma polymer coating. Both reduced pressure plasmas and atmospheric pressure plasmas can be used.

Cleaning is preferably carried out on an aqueous basis, with and without detergent. Nevertheless, conventional industrial cleaners can also be used. However, to obtain a thin layer, rubbing with sharp objects, such as, for example, sand or splinters in cloths, is to be avoided. Rinsing with clear water is advantageous.

The articles according to the invention can be, in particular, one of the following articles: rims; hub cap; aluminium section, in particular for windows or showers; windows; trims (interior and exterior), in particular for cars, aircraft or rail vehicles; windmill vanes, aircraft outer skin or regions thereof; metal facing, in particular for houses, facing and coverings for kitchens and kitchen equipment; displays especially for kitchens; glazing; car body part; motor cycle components; drinks containers; paint containers; ink containers; watercolour cartridges; bottles; kitchen equipment; frying pan; information signs; warning signs; re-usable vessels for foods, such as, for example, bottles or tubs.

As a rule these articles are not provided with a complete plasma polymer coating, but are provided with this coating only in the areas where easy cleaning is important.

Preferred plasma polymer coatings are characterised by one or more of the following characteristics:

| | |
|---|---|
| Hardness | Approx. 1.4 ± 0.1 GPa |
| Modulus of elasticity | Approx. 7.9 ± 0.3 GPa |
| Pencil hardness | Error free up to 2 H |
| Surface energy | Approximately 25 to 30 mN/m |
| UV stability | At least 1000 h met in accordance with DIN 50010 |
| Transparency | Transparent in the visible region of the spectrum |
| Thermal stability | Approx. 350° C. |
| Chemical stability (at RT) | e.g.: acetone, cyclohexane, ethanol, toluene |
| Layer thickness | 1 nm–1 μm |

ESCA spectra were recorded and evaluated (Table 1) for preferred plasma polymer coatings. No H was detected in these spectra. In the examples the energy maxima and the half widths (FWHM) of the individual peaks are indicated. See further below for the design of the production process.

The ESCA tests were carried out using a VG ESCALAB 220-XL spectrometer. The analytical chamber is equipped with an X-ray source for monochromatised Al $K_\alpha$ radiation, an electron source as a neutraliser and a quadrupole mass spectrometer. The installation also has a magnetic lens, which focuses the photoelectrons on the hemispherical analyser.

Because of the high intensity and energy resolution (monochromatised Al $K_\alpha$ radiation), the spectrometer is particularly suitable for the analysis of thin organic layers.

The transmission function of the spectrometer was determined using a clean silver sample. The sensitivity factors for C 1s, O 1s and Si 2p were determined using trimethylthiloxy-terminated PDMS (polydimethylsiloxane) with $M_m$=64000 g/mol as reference material.

TABLE 1

Results of the ESCA analyses on preferred plasma polymer coatings. The data in atomic percent relate to the total number of the O, C and Si atoms in the layers concerned (Σ atomic percent (O, C, Si) = 100)

|  | O 1s Amount [atomic percent] Energy max. [eV] FWHM [eV] | C 1s Amount [atomic percent] Energy max. [eV] FWHM [eV] | Si 2p Amount [atomic percent] Energy max. [eV] FWHM [eV] |
|---|---|---|---|
| Example 1 (Low pressure plasma) | 39.5 532.90 1.40 | 36.5 285.0 1.40 | 24.0 102.95 2.0 |
| Example 2 (Low pressure plasma) | 46.0 532.95 1.60 | 30.0 285.0 1.50 | 24.0 103.20 2.1 |
| Example 3 (Atmospheric pressure plasma) | 51.8 533.2 1.41 | 19.6 285.0 1.24 | 28.6 103.55 1.98 |
| Example 4 (Atmospheric pressure plasma) | 42.0 532.85 1.58 | 32.5 532.85 1.32 | 25.5 103.05 1.85 |

The present invention also relates to processes for the manufacture of articles with a plasma polymer coating. Preferred process designs and articles according to the invention resulting therefrom are explained in more detail below for the Examples 1 to 4 of plasma polymer coatings given in Table 1:

RE EXAMPLE 1

The surface of a metallic substrate with a $R_a$ value according to DIN 4768 (=arithmetic mean of the absolute contributions of all deviations of the roughness profile from the midline) of 300 nm was activated by means of a plasma that had been adjusted to be reducing.

A plasma polymer coating was then applied, the plasma being formed from oxygen ($O_2$) and hexamethyldisiloxane (HMDSO). Here the ratio of oxygen to HMDSO was so adjusted that the gas flow of HMDSO was approximately half as large as the gas flow of $O_2$. The precise process parameters for the deposition of the coating forming the surface were:

| Gas flow $O_2$: | 260 cm$^3$/min |
| Gas flow HMDSO: | 120 cm$^3$/min |
| Power (W): | 4000 |
| Time (sec): | 300 |
| Pressure (mbar): | 0.045. |

An FTIR spectrum of the plasma polymer (anti-soiling) coating forming the surface of the article is appended as FIG. 1.

According to Table 1, the mole ratio of oxygen to silicon was therefore approximately:

$n(O){:}n(Si)=1.65{:}1$ and, according to Table 1, the ratio of carbon to silicon was approximately:

$n(C){:}n(Si)=1.52{:}1$.

The plasma polymer coating displayed good chemical and mechanical stability as well as hydrophobic behaviour. It did not tend to form cracks because of inherent stresses (such as, for example, coarse glass-like layers with a mole ratio n (O): n (Si) of approximately 2:1 do).

In addition, a microelementary analysis for hydrogen and carbon was carried out. For this purpose a salt crystal was first coated under the same conditions as indicated above, so that the coating could be stripped off in a water bath. The layer stripped off was dried at 100° C. to constant weight. The following percentages by mass were then found in a duplicate measurement:

TABLE 2

Hydrogen and carbon content of the surface that can be cleaned easily.

| Element | Percent by mass [%] | Average value of percent by mass [%] | Average value of percent by mass/molar mass [mol/100 g of the layer] |
|---|---|---|---|
| C | 19.6; 20.0 | 19.8 | 1.65 |
| H | 4.25; 4.34 | 4.30 | 4.30 |

This gives a H/C atomic number ratio of 2.61:1.

RE EXAMPLE 2

The surface of a lacquer-coated car rim (commercially available acrylic powdered lacquer) with a $R_a$ value according to DIN 4768 of 0.4 μm was activated by means of an oxygen plasma.

A plasma polymer coating was then applied, the plasma being formed from oxygen ($O_2$) and hexamethyldisiloxane (HMDSO). During this operation the ratio of oxygen to HMDSO was varied in such a way that ultimately the gas flow of HMDSO was in a ratio of 27.5:100 to the gas flow of $O_2$. The precise process parameters for the deposition of the coating forming the surface were finally:

| Gas flow $O_2$: | 100 cm$^3$/min |
| Gas flow HMDSO: | 27.5 cm$^3$/min |
| Power (W): | 2500 |
| Time (sec): | 300 |
| Pressure (mbar): | 0.03. |

The FTIR spectrum in the plasma polymer (anti-soiling) coating forming the surface of the article essentially corresponds to the spectrum shown in FIG. 1 for Example 1.

The mole ratio of oxygen to silicon was approximately:

$n(O){:}n(Si)=1.92{:}1$ and the ratio of carbon to silicon was approximately:

$n(C){:}n(Si)=1.25{:}1$.

and the ratio of hydrogen to carbon was approximately:

$n(H){:}n(C)=3.1{:}1$.

The rim coated with the plasma polymer optically corresponded to the non-coated lacquered rim that was used as substrate. In tests it was found that the plasma polymer anti-soiling coating was highly resistant to heat (up to temperatures of approximately 360° C.).

Compared with the lacquer-coated rim used as substrate, which was a commercially available product, the rim produced according to Example 2 soiled more slowly in use and there was no formation of microcracks in the lacquer coating such as inevitably occur when commercially available rims are used. Burning in of brake dust, as has been found with the commercially available comparison rims, could not be found with the rim produced in the manner according to the invention.

Surface soiling of the rim according to the invention by brake dust was already easy to rinse off by rainwater; treatment in a car wash, of course, also led to residue-free cleaning of the rim.

RE EXAMPLE 3

In contrast to the other two examples, the coating in this example was produced with the aid of atmospheric pressure plasma polymerisation. A plasma tool such as has been described in the patent DE 195 32 412 C2 was used for this purpose.

The most important parameters for deposition of this functional and transparent layer are:

| Ionisation gas: | Nitrogen, 150 l/min |
|---|---|
| Precursor: | HMDSO, 3 g/min |
| Average intermediate circuit voltage (for arrangement of 7 nozzles): | 450 V |
| Distance between substrate and nozzle: | 15 mm |
| Travelling speed: | 100 m/min |

Displays for kitchen stoves could be coated by this means. The displays coated in this way can be cleaned very easily compared with uncoated displays. If required, the layers can also be applied in such a thickness that protection against scratching is additionally produced.

Displays for kitchen stoves could be coated by this means. The displays coated in this way can be cleaned very easily compared with uncoated displays. If required, the layers can also be applied in such a thickness that protection against scratching is additionally produced. (sic)

RE EXAMPLE 4

The functional and transparent coating was produced as [lacuna] Example 3, but with the following parameters:

| Ionisation gas: | Nitrogen, 120 l/min |
|---|---|
| Precursor: | HMDSO, 2 g/min |
| Average intermediate circuit voltage (for arrangement of 7 nozzles): | 400 V |
| Distance between substrate and nozzle: | 30 mm |
| Travelling speed: | 20 m/min |

Displays for kitchen stoves could also be coated by this means. The displays coated in this way can be cleaned very easily compared with uncoated displays. Compared with the layer from Example 3, the chemical, thermal and mechanical stability is distinctly improved in the case of the layer from Example 4, which is to be ascribed to the changed composition of the layer (c.f. Table 1).

The invention claimed is:

1. Article, comprising a substrate and a plasma polymer coating comprising silicon, oxygen and carbon bonded to the surface of the substrate, in respect of which coating the following applies in the case of determination by means of ESCA:

the mole ratio O:Si is >1.25 and <2.6
and the mole ratio C:Si is >0.6 and <2.2, and the plasma polymer coating further comprising hydrogen and/or fluorine, where:

$1.8:1 < n(\text{H and/or F}):n(\text{C}) < 3.6:1$ preferably $2.2:1 < n(\text{H and/or F}):n(\text{C}) < 3.3:1$.

2. Article according to claim 1, wherein the coating contains
at least 22 and at most 27 atomic percent Si,
at least 25 and at most 50 atomic percent O and
at least 25 and at most 50 atomic percent C based on its total atomic number without hydrogen and/or fluorine.

3. Article according to claim 1, characterised in that the roughness value $R_a$ of the surface of the plasma polymer coating is less than 1 µm, preferably less than 0.3 µm, and more preferentially less than 0.1 µm.

4. Article comprising
a substrate and
a plasma polymer coating comprising oxygen, carbon and silicon bonded to the surface of the substrate, wherein the roughness value $R_a$ of the surface of the coating is less than 1 µm, preferably less than 0.3 µm, and more preferentially less than 0.1 µm;
wherein the plasma polymer coating has an angle of contact with water of more than 90°, preferably more than 95°, preferably more than 100°; and
the plasma polymer coating is bonded to the substrate via an intermediate layer.

5. Article according to claim 1, characterised in that the plasma polymer coating has an angle of contact with water of more than 90°, preferably more than 95°, preferably more than 100°.

6. Article according to claim 1, characterised in that the plasma polymer coating is bonded to the substrate via an intermediate layer.

7. Article according to claim 1, characterised in that the article is selected from the group consisting of:
rims; hub cap; aluminum section; windows; trims; windmill vanes; metal facing; facing and coverings for kitchens and kitchen equipment; displays; glazing; car body part; motor cycle components; drinks containers; paint containers; ink containers; watercolor cartridges; bottles; kitchen equipment; frying pan; information signs; warning signs; re-usable vessels for foods, such as, for example, bottles or tubs.

8. Article according to claim 2, characterised in that the roughness value $R_a$ of the surface of the plasma polymer coating is less than 1 µm, preferably less than 0.3 µm, and more preferentially less than 0.1 µm.

9. Article according to claim 4, characterised in that:
the article is selected from the group consisting of:
rims; hub cap; aluminum section for windows or showers; windows; trims; windmill vanes; metal facing for houses; facing and coverings for kitchens and kitchen equipment; displays for kitchens; glazing car body part; motor cycle components; drinks containers; paint containers; ink containers; watercolor cartridges; bottles; kitchen equipment; frying pan; information signs; warning signs; re-usable bottles or tubs.

10. Article according to claim 2, characterised in that:
the plasma polymer coating has an angle of contact with water of more than 90°, preferably more than 95°, preferably more than 100°;

the plasma polymer coating is bonded to the substrate via an intermediate layer;

the article is selected from the group consisting of:

rims; hub cap; aluminum section for windows or showers; windows; trims; windmill vanes; metal facing for houses; facing and coverings for kitchens and kitchen equipment; displays for kitchens; glazing; car body part; motor cycle components; drinks containers; paint containers ; ink containers; watercolor cartridges; bottles; kitchen equipment; frying pan; information signs; warning signs; re-usable bottles or tubs.

11. Article according to claim 3 characterised in that:

the plasma polymer coating has an angle of contact with water of more than 90°, preferably more than 95°, preferably more than 100°;

the plasma polymer coating is bonded to the substrate via an intermediate layer;

the article is selected from the group consisting of:

rims; hub cap; aluminum section for windows or showers; windows; trims; windmill vanes; metal facing for houses; facing and coverings for kitchens and kitchen equipment; displays for kitchens; glazing; car body part; motor cycle components; drinks containers; paint containers; ink containers; watercolor cartridges; bottles; kitchen equipment; frying pan; information signs; warning signs; re-usable bottles or tubs.

12. Article according to claim 6, characterised in that:

the plasma polymer coating has an angle of contact with water of more than 90°, preferably more than 95°, preferably more than 100°;

the plasma polymer coating is bonded to the substrate via an intermediate layer;

the article is selected from the group consisting of:

rims; hub cap; aluminum section for windows or showers; windows; trims; windmill vanes; metal facing for houses; facing and coverings for kitchens and kitchen equipment; displays for kitchens; glazing; car body part; motor cycle components; drinks containers; paint containers; ink containers; watercolor cartridges; bottles; kitchen equipment; frying pan; information signs; warning signs; re-usable bottles or tubs.

13. Article, comprising a substrate; and a plasma polymer coating comprising silicon, oxygen and carbon bonded to the surface of the substrate, in respect of which coating the following applies in the case of determination by means of ESCA:

the mole ratio O:Si is >1.25 and <2.6; and the mole ratio C:Si is >0.6 and 2.2, wherein the plasma polymer coating is bonded to the substrate via an intermediate layer.

* * * * *